(12) United States Patent
Hücker

(10) Patent No.: US 6,255,808 B1
(45) Date of Patent: Jul. 3, 2001

(54) DEVICE FOR MEASURING PARTIAL DISCHARGE IN GAS-INSULATED HIGH VOLTAGE FACILITIES, THE DEVICE HAVING A HF SENSOR AND UHF SENSOR

(75) Inventor: Thomas Hücker, Dallgow-Doeberitz (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/463,763

(22) PCT Filed: Jul. 30, 1998

(86) PCT No.: PCT/DE98/02290

§ 371 Date: Jun. 21, 2000

§ 102(e) Date: Jun. 21, 2000

(87) PCT Pub. No.: WO99/06847

PCT Pub. Date: Feb. 11, 1999

(30) Foreign Application Priority Data

Jul. 31, 1997 (DE) .............................................. 197 34 552

(51) Int. Cl.⁷ ....................... G01R 31/100; H01H 31/12; G01C 21/02; H04J 3/02
(52) U.S. Cl. ........................ 324/122; 324/551; 324/536; 250/206.1; 370/540
(58) Field of Search .................................... 324/122, 551, 324/536; 250/206.1; 370/540

(56) References Cited

U.S. PATENT DOCUMENTS

| | | | |
|---|---|---|---|
| 4,411,019 | * 10/1983 | Rypkema | 455/180.2 |
| 4,763,327 | * 8/1988 | Fontaine et al. | 370/540 |
| 5,146,170 | * 9/1992 | Ishikawa et al. | 324/536 |
| 5,168,152 | * 12/1992 | Kelley | 250/206.1 |
| 5,396,180 | * 3/1995 | Hampton et al. | 324/551 |
| 5,485,347 | * 1/1996 | Miura | 702/128 |
| 5,569,840 | * 10/1996 | Thuries | 73/40 |
| 5,793,336 | * 8/1998 | Shoemaker et al. | 343/795 |

FOREIGN PATENT DOCUMENTS

| | | |
|---|---|---|
| 195 48 466 | 6/1997 | (DE) . |
| 0 488 719 | 6/1992 | (EP) . |
| 0 699 918 | 3/1996 | (EP) . |
| 0 780 692 | 6/1997 | (EP) . |
| 230 214 | * 11/1996 | (GB) . |
| 8317087 | * 11/1996 | (JP) . |

OTHER PUBLICATIONS

Hampton et al. "Diagnostic measurements at UHF in gas insulated substations" pp. 137–144, Mar. 1988.*

* cited by examiner

Primary Examiner—Glenn W. Brown
Assistant Examiner—Wasseem H. Hamdan
(74) Attorney, Agent, or Firm—Kenyon & Kenyon

(57) ABSTRACT

To perform a reliable and calibrated measurement of partial discharges, a first calibratable sensor and a second sensor are arranged in a metal enclosure. The first calibrated sensor picks up signal components in the HF (High Frequency) range, and the second non-calibrated sensor picks up signal components in the UHF (Ultra-High Frequency) range. An HF signal component picked up by the first sensor is transmitted to a partial discharge analyzer. The opening time of the gate device is determined by a UHF signal component picked up by the second sensor.

6 Claims, 1 Drawing Sheet

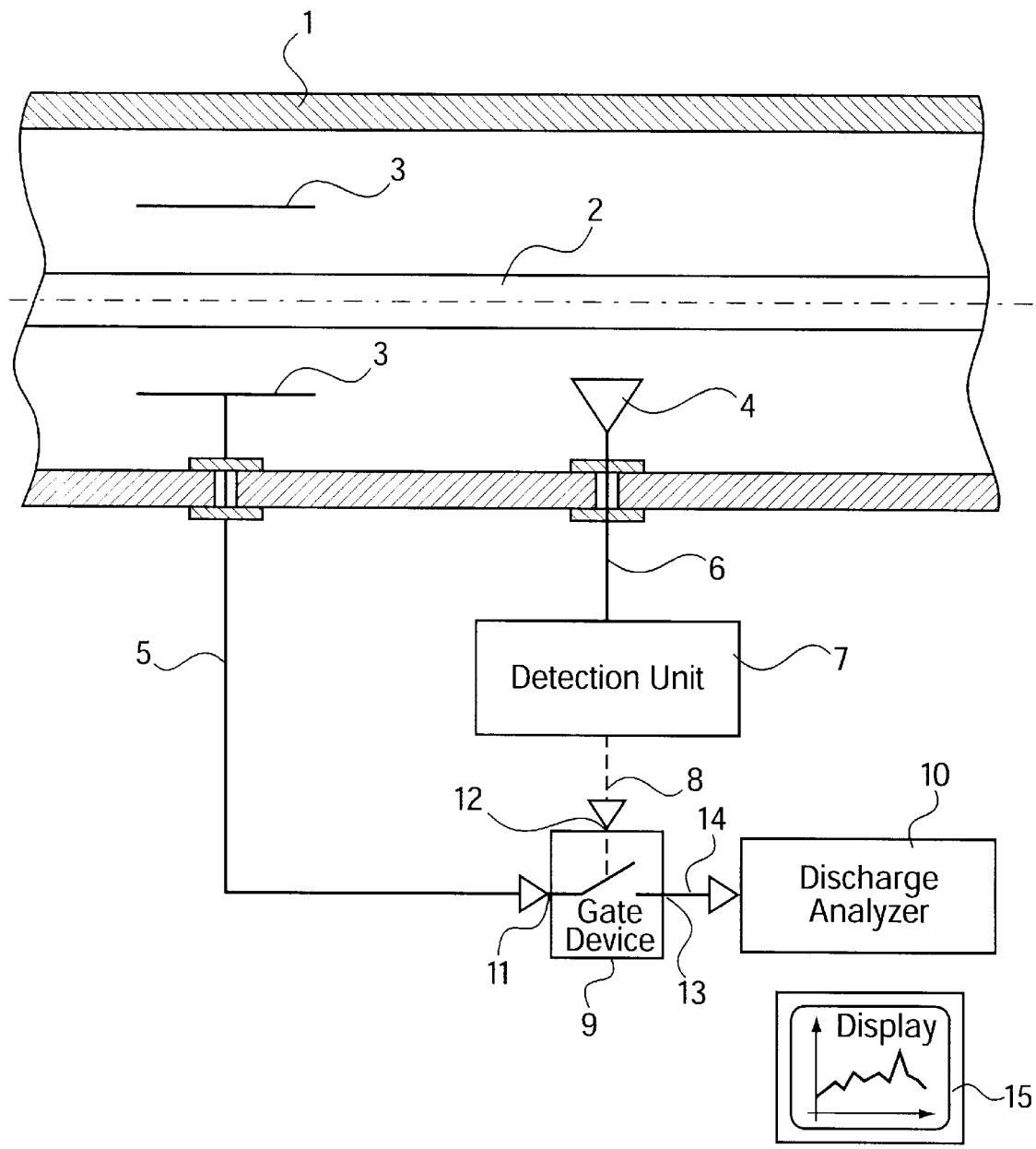

DEVICE FOR MEASURING PARTIAL DISCHARGE IN GAS-INSULATED HIGH VOLTAGE FACILITIES, THE DEVICE HAVING A HF SENSOR AND UHF SENSOR

FIELD OF THE INVENTION

The present invention relates to a device for measuring partial discharges in gas-insulated high voltage facilities, having a first calibratable sensor suitable for measurement in the HF range and a second sensor suitable for detecting signal components characteristic of partial discharges, in particular for measurement in the UHF range, arranged inside a metal enclosure, having a first branch for processing an HF signal component and a second branch for processing a UHF signal component as well as having a gate device connected to the first and second sensors.

BACKGROUND INFORMATION

European Patent Application 488 719 A2 describes a device and a method of detecting partial discharges in gas-insulated high voltage facilities (see FIG. 6 there), where a fundamental frequency and an HF component below a few hundred kHz, possibly generated by interference, are picked up. These signal components can be separated using filter devices. The signals thus obtained are converted to a form suitable for further processing by using filter devices and sent to a computer system. The signal obtained in the high frequency range below a few hundred kHz is used to identify external interference. The zero crossing of the high voltage acts as a trigger signal for the start of the partial discharge measurement. Partial discharge signals in the range of a few 10 MHz are recorded by a second sensor and processed further in a suitable signal processing branch for identification of the partial discharges. With the wiring described there, this sensor is operated at a few 10 MHz in antenna mode and thus cannot be calibrated for partial discharge measurements.

In this connection, the HF range should be understood to be the frequency range between a few 10 kHz and 100 MHz and the UHF range should be understood to be the frequency range above 100 MHz.

German Patent Application 195 48 466 A1 describes a device the gate is blocked when there is a measurement signal from a sensor, with the input signal for controlling the gate being an HF (High Frequency) signal below 10 MHZ, for example. The signal allowed through by the gate for further processing may be a broad-band UHF signal in the range up to 1.5 GHz, for example. In this way, interference in measurement of partial discharges is to be avoided. However, no calibrated measurement is provided with this system.

SUMMARY

An object of the present invention is to improve upon the reliability of measurement of partial discharges while at the same time permitting a calibrated measurement.

This object is achieved according to the present invention by the fact that the gate device is actuated in the presence of a UHF signal component characteristic of a partial discharge, and when actuated, it allows the HF signal component to pass through for further processing.

The use of a first calibratable sensor allows a very accurate and reproducible measurement result to be achieved in a partial discharge measurement. Such a sensor may have, for example, a measuring electrode for capacitive coupling to a high voltage conductor arranged in the high voltage facility. The second sensor, which is wired for and suitable for the UHF range, cannot be calibrated due to its external wiring, but it functions as a detector for partial discharges in conjunction with the first sensor. The second sensor merely supplies information about the existence or non-existence of a partial discharge and actuates the gate device accordingly. No calibration of the second sensor is necessary. For example, such a UHF sensor may have an antenna for detection of electromagnetic radiation or it may have a device which detects a signal component that is typical of partial discharges by some other method, e.g., a chemical, optical or acoustic method. Due to the use of two sensors, a first sensor which is active in the HF range and a second sensor which is active in the UHF range, and due to the two-branch design, the required signal processing for reliable measurement of partial discharges is implemented on a sensor level. The gate device is suitable for controlling the interaction of the UHF signal component and the HF signal component. Opening of the gate device for a certain period of time can be prompted, or optionally the duration of opening of the gate device during which the HF signal component is transmitted for further processing can be determined by a second input (control input) through the UHF signal component.

On exposure to external interference which cannot be attributed to a partial discharge, a UHF signal component which is optionally present intrudes the high voltage facility only with great damping, so that in this case the gate device is not actuated. The gate device is not opened until a certain signal threshold is exceeded.

In an advantageous embodiment of the present invention, the first and the second sensors may be in direct proximity to one another.

In this way, both sensors receive the same signal with regard to both time and space without allowing various distortions of the signal to occur.

In another advantageous embodiment of the present invention, a cone antenna may be provided as a UHF sensor.

Because of their design, cone antennas are especially suitable for measuring UHF signals.

For example, cylindrical electrodes which surround the high voltage conductor concentrically are suitable for measuring HF signals.

A single sensor may also be provided to advantage as a receiver for both UHF and HF signals.

Additional sensors may be eliminated by using just one broad-band sensor. This sensor must then be operable simultaneously in both the HF range (capacitive operation) and in the UHF range (antenna operation) due to appropriate wiring with two signal processing branches.

In a method for measuring partial discharges in gas-insulated high voltage facilities, a UHF signal component and an HF signal component are received within an enclosure, and if there is a UHF signal component exceeding a certain threshold, a gate element is actuated to transmit the HF signal component for further processing.

This separate detection of a UHF signal component and an HF signal component yields a signal separation based on the frequency band directly after signal pickup. The UHF signal component thus obtained is used as a control signal to open the gate device through which the HF signal is allowed to pass.

The present invention may be implemented using a programmable computer equipped with analog inputs. HF and UHF signal components picked up by the sensors go to the computer via the analog inputs. A computer program processes and weights the signal components and displays the result on a monitor or a screen.

One embodiment of the present invention is described below with reference to the drawing and its functioning is explained.

BRIEF DESCRIPTION OF THE DRAWINGS

The FIGURE schematically shows a longitudinal section through a selected area of a gas-insulated switchgear having a device according to the present invention.

DETAILED DESCRIPTION

As shown in the FIGURE, a gas-insulated switchgear is surrounded by a grounded, gas-tight, cylindrical metal enclosure 1 filled with insulating gas (mainly $SF_6$ gas is used). A conductor 2 arranged axially inside enclosure 1 is held in position by supporting insulators at regular intervals. A calibratable HF sensor 3 in the form of a hollow metal cylinder is arranged around conductor 2 without coming in contact with it. In addition, an insulated UHF sensor 4 is arranged in enclosure 1; it picks up the UHF signal component of a partial discharge and sends it to a UHF pulse detection unit 7 over a measuring branch 6. A measuring branch 5 leads from calibratable HF sensor 3 to a first input 11 of a gate device 9. A branch 8 leads from UHF pulse detection unit 7 to a second input 12 of same gate device 9. Second input 12 of gate device 9 is control input 12, i.e., it determines the duration of the gate opening. First input 11 is signal input 11. On actuation of control input 12, a signal can be transmitted from signal input 11 to output 13 of gate device 9. A connection 14 leads from output 13 of gate device 9 to a partial discharge analyzer 10. The partial discharge signal can be represented graphically on a display screen 15.

When there is a partial discharge, signals with frequency components in the UHF range occur. When there is interference inside and outside the enclosure that is not attributable to partial discharge, there is little or no frequency component in the UHF range within the gas-insulated switchgear. This fact is utilized in the present invention to prevent interference signals not resulting from partial discharges from being falsely measured by the HF sensor in measuring partial discharges. Such signals are blocked by gate device 3.

If an actual partial discharge occurs then, UHF sensor 4 picks up the UHF signal component and relays it to UHF analyzer 7, where the existence of a partial discharge is recorded. Since it is a partial discharge, a signal that goes to control input 12 of gate device 9 and actuates it for a defined period of time is generated. Signals not attributed to a partial discharge within the high voltage facility are blanked out according to the present invention. If there is a partial discharge, a partial discharge signal is picked up by HF sensor 3 and goes over measurement line 5 to signal input 11 of gate device 9. While control input 12 is actuated, the partial discharge signal of sensor 3 can be transmitted to output 13, from which it goes to partial discharge analyzer 10 where it can be analyzed.

What is claimed is:

1. A device for measuring a partial discharge in a gas-insulated high voltage facility, comprising:

a first calibratable sensor for measuring a high-frequency (HF) signal component in an HF range;

a second sensor for detecting an ultra-high frequency (UHF) signal component characteristic of a partial discharge;

a metal enclosure, the first sensor and the second sensor being arranged in the metal enclosure;

a first branch coupled to the first sensor for processing the HF signal component;

a second branch coupled to the second sensor for processing the UHF signal component; and a gate device coupled to the first sensor and second sensor, the gate device being actuated when the UHF signal component characteristic of a partial discharge is sensed, wherein when the gate device is actuated, the gate device allows the HF signal component to pass through for further processing.

2. The device according to claim 1, wherein the high-voltage facility is a switchgear.

3. The device according to claim 1, wherein the first sensor and the second sensor are in direct proximity to one another.

4. The device according to claim 1, wherein the second sensor is a cone sensor.

5. The device according to claim 1, wherein a single sensor is used as the first sensor and the second sensor.

6. A method of calibratable measurement of a partial discharge in a gas-insulated switchgear, comprising:

picking up a UHF signal component and an HF signal component within an enclosure;

if the UHF signal component exceeds a predetermined threshold, actuating a gate element; and after actuating the gate element, transmitting the HF signal component for further processing.

\* \* \* \* \*